US012635471B2

(12) United States Patent
Suzuki et al.

(10) Patent No.: US 12,635,471 B2
(45) Date of Patent: May 19, 2026

(54) METHOD OF LAYING PROTECTIVE SHEET AND PROTECTIVE SHEET

(71) Applicant: DISCO CORPORATION, Tokyo (JP)

(72) Inventors: Koshiro Suzuki, Tokyo (JP); Masamitsu Kimura, Tokyo (JP); Hideji Horita, Tokyo (JP); Yuya Tanaka, Tokyo (JP); Takashi Nakahara, Tokyo (JP); Norihisa Arifuku, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 393 days.

(21) Appl. No.: 18/409,076

(22) Filed: Jan. 10, 2024

(65) Prior Publication Data

US 2024/0258149 A1      Aug. 1, 2024

(30) Foreign Application Priority Data

Jan. 27, 2023      (JP) ................................. 2023-011207

(51) Int. Cl.
*H10P 72/70*          (2026.01)
(52) U.S. Cl.
CPC ...... *H10P 72/7402* (2026.01); *H10P 72/7416* (2026.01); *H10P 72/7422* (2026.01); *H10P 72/7442* (2026.01)
(58) Field of Classification Search
CPC ............. H10P 72/7402; H10P 72/7416; H10P 72/7422; H10P 72/7442; H10P 72/0442;

H10P 72/0448; H10P 72/0402; H10P 72/0428; H10P 72/7404; H10P 72/78; H10W 74/014; B24B 9/065
See application file for complete search history.

(56) References Cited

U.S. PATENT DOCUMENTS

| | | | |
|---|---|---|---|
| 2018/0342398 A1* | 11/2018 | Sekiya | ................... B24B 9/065 |
| 2019/0308399 A1* | 10/2019 | Mori | ...................... B32B 37/02 |
| 2020/0051862 A1* | 2/2020 | Piao | ........................ H10P 54/00 |
| 2021/0043469 A1* | 2/2021 | Kakinuma | .......... H10P 72/0442 |
| 2021/0151331 A1* | 5/2021 | Arifuku | .............. H10P 72/7402 |
| 2022/0051897 A1* | 2/2022 | Chang | .................... B24B 7/228 |

FOREIGN PATENT DOCUMENTS

| | | |
|---|---|---|
| JP | 2018526826 A | 9/2018 |
| JP | 2019186355 A | 10/2019 |
| WO | 2017036512 A1 | 3/2017 |

* cited by examiner

*Primary Examiner* — Mouloucoulaye Inoussa
(74) *Attorney, Agent, or Firm* — GREER BURNS & CRAIN, LTD.

(57)          ABSTRACT
A method of laying a protective sheet on a face side of a wafer includes preparing a first protective sheet having, on one surface thereof, a non-adhesive portion to be coextensive with a device region of the wafer and an adhesive portion to be positioned along an outer circumferential excessive region of the wafer, affixing the one surface of the first protective sheet to the face side of the wafer, dropping a liquid resin onto a surface of a second protective sheet that has surface irregularities ranging from Ra 0.2 to 7 μm and is free of an adhesive layer, bringing another surface of the first protective sheet into facing relation to the surface of the second protective sheet onto which the liquid resin has been dropped, and curing the liquid resin.

7 Claims, 10 Drawing Sheets

FIG.5

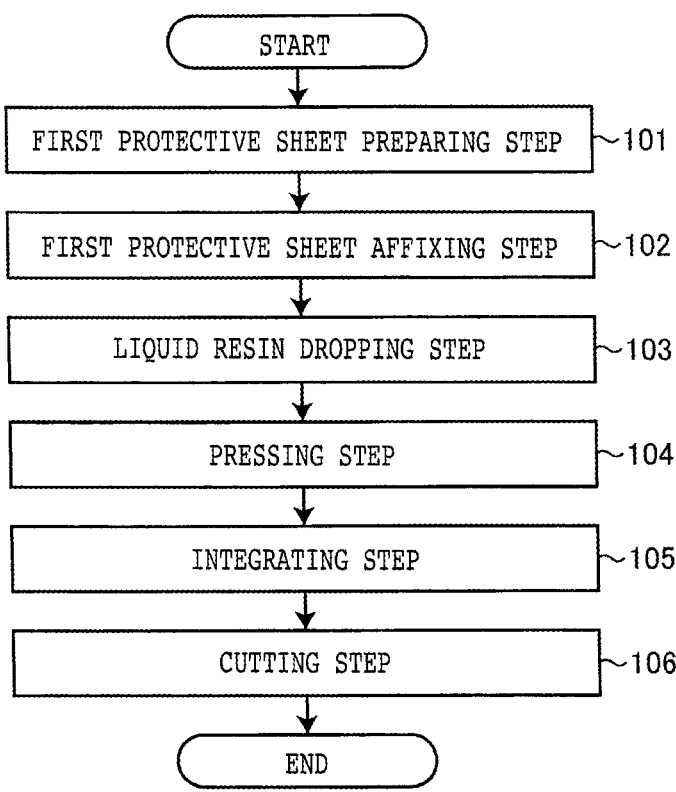

```
                    ┌─────────────┐
                    │    START    │
                    └─────────────┘
                           │
                           ▼
        ┌──────────────────────────────────────┐
        │ FIRST PROTECTIVE SHEET PREPARING STEP │─101
        └──────────────────────────────────────┘
                           │
                           ▼
        ┌──────────────────────────────────────┐
        │  FIRST PROTECTIVE SHEET AFFIXING STEP │─102
        └──────────────────────────────────────┘
                           │
                           ▼
        ┌──────────────────────────────────────┐
        │       LIQUID RESIN DROPPING STEP      │─103
        └──────────────────────────────────────┘
                           │
                           ▼
        ┌──────────────────────────────────────┐
        │             PRESSING STEP             │─104
        └──────────────────────────────────────┘
                           │
                           ▼
        ┌──────────────────────────────────────┐
        │            INTEGRATING STEP           │─105
        └──────────────────────────────────────┘
                           │
                           ▼
        ┌──────────────────────────────────────┐
        │             CUTTING STEP              │─106
        └──────────────────────────────────────┘
                           │
                           ▼
                    ┌─────────────┐
                    │     END     │
                    └─────────────┘
```

FIG.6

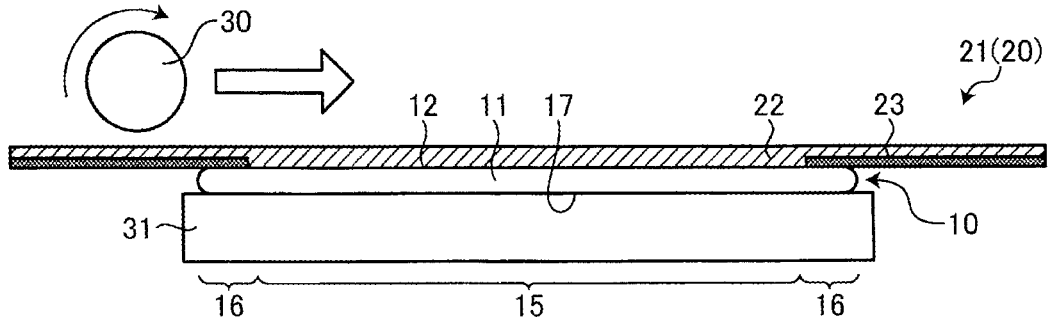

METHOD OF LAYING PROTECTIVE SHEET AND PROTECTIVE SHEET

BACKGROUND OF THE INVENTION

Field of the Invention

The present invention relates to a method of laying a protective sheet and a protective sheet.

Description of the Related Art

According to the semiconductor device fabrication process, it has been the general practice to grind the reverse side of a wafer that includes a plurality of devices in its face side until the wafer is thinned down to a predetermined thickness and thereafter to divide the wafer into a plurality of individual device chips with a cutting apparatus or a laser processing apparatus. Some wafers have a plurality of protrusions such as bumps electrically connected as electrodes to devices in their device region. When such a wafer is ground by a grinding wheel, the grinding wheel tends to apply a contact pressure to the wafer. In order to prevent the contact pressure from concentrating on the protrusions and consequently breaking the wafer, it has been customary to affix, to the face side of the wafer, a protective sheet having an adhesive layer that is thick enough to embed the protrusions therein, and grind the reverse side of the wafer with the protective sheet affixed to the face side thereof.

However, when the protective sheet is peeled off from the face side of the wafer after the wafer has been ground, the adhesive layer is liable to leave residues on the protrusions, tending to cause a quality issue with respect to device chips fabricated from the wafer. In view of such a problem, there has been developed a method of protecting a wafer with a protective sheet including a protective film that is free of an adhesive substance in its area corresponding to the device region of the wafer and a base film that is integrated with the protective film with a cushion layer interposed therebetween (see JP 2018-526826T and JP2019-186355A). According to JP2019-186355A, for example, a protective sheet is laid on a wafer by dropping a liquid resin as a cushion layer onto a base film and pressing the liquid resin against a protective film placed on the wafer.

SUMMARY OF THE INVENTION

However, the base film has poor wettability on its surface supplied with the liquid resin, preventing the liquid resin from spreading all over the base film and leaving areas unfilled with the liquid resin on the base film. Those unfilled regions are likely to reduce the surface accuracy of the reverse side of the wafer at the time the wafer is ground. Another problem is that the base film tends to stick to a chuck table that is holding the base film, and it is time-consuming to peel off the base film from the chuck table after the grinding process.

It is therefore an object of the present invention to provide a method of laying a protective sheet and a protective sheet that are capable of increasing the surface accuracy of the reverse side of a wafer whose face side is protected by the protective sheet at the time the reverse side is ground.

In accordance with an aspect of the present invention, there is provided a method of laying a protective sheet on a face side of a wafer including a device region where a plurality of devices are present and an outer circumferential excessive region surrounding the central device region, including a first protective sheet preparing step of preparing a first protective sheet having, on one surface thereof, a non-adhesive portion to be coextensive with the device region of the wafer and an adhesive portion to be positioned along the outer circumferential excessive region of the wafer, a first protective sheet affixing step of positioning the non-adhesive portion of the first protective sheet over the device region of the wafer, positioning the adhesive portion over the outer circumferential excessive region of the wafer, and affixing the one surface of the first protective sheet to the face side of the wafer, a liquid resin dropping step of preparing a second protective sheet free of an adhesive layer and dropping a liquid resin that can be cured by an external stimulus onto a surface of the second protective sheet, a pressing step of bringing another surface of the first protective sheet affixed to the wafer into facing relation to the surface of the second protective sheet onto which the liquid resin has been dropped and moving the first protective sheet and the second protective sheet relatively closely to each other, thereby spreading the liquid resin over the second protective sheet, and an integrating step of applying the external stimulus to the liquid resin spread in the pressing step to cure the liquid resin, thereby integrating the first protective sheet affixed to the wafer, the liquid resin, and the second protective sheet with each other, in which the second protective sheet has surface irregularities ranging from Ra 0.2 to 7 $\mu$m on at least the surface thereof onto which the liquid resin is to be dropped.

In accordance with another aspect of the present invention, there is provided a method of laying a protective sheet on a face side of a wafer including a device region where a plurality of devices are present and an outer circumferential excessive region surrounding the device region, including a first protective sheet preparing step of preparing a first protective sheet having, on one surface thereof, a non-adhesive portion to be coextensive with the device region of the wafer and an adhesive portion to be positioned along the outer circumferential excessive region of the wafer, a first protective sheet affixing step of positioning the non-adhesive portion of the first protective sheet over the device region of the wafer, positioning the adhesive portion over the outer circumferential excessive region of the wafer, and affixing the one surface of the first protective sheet to the face side of the wafer, a liquid resin dropping step of dropping a liquid resin that can be cured by an external stimulus onto another surface of the first protective sheet affixed to the wafer, a pressing step of bringing a second protective sheet free of an adhesive layer into facing relation to the other surface of the first protective sheet onto which the liquid resin has been dropped and moving the first protective sheet and the second protective sheet relatively closely to each other, thereby spreading the liquid resin over the first protective sheet, and an integrating step of applying the external stimulus to the liquid resin spread in the pressing step to cure the liquid resin, thereby integrating the first protective sheet affixed to the wafer, the liquid resin, and the second protective sheet with each other, in which the second protective sheet has surface irregularities ranging from Ra 0.2 to 7 $\mu$m on at least a surface thereof that faces the liquid resin.

In accordance with a further aspect of the present invention, there is provided a method of laying a protective sheet on a face side of a wafer including a first protective sheet bonding step of bringing one surface of a first protective sheet free of an adhesive layer and the face side of the wafer into facing relation to each other and bringing the first protective sheet into close contact with the wafer while heating the first protective sheet, thereby integrating the first protective sheet and the wafer with each other, a liquid resin dropping step of dropping a liquid resin that can be cured by an external stimulus onto another surface of the first protective sheet whose one surface has been bonded to the wafer, a pressing step of bringing a second protective sheet free of an adhesive layer into facing relation to the other surface of the first protective sheet onto which the liquid resin has been dropped and moving the first protective sheet and the second protective sheet relatively closely to each other, thereby spreading the liquid resin over the first protective sheet, and an integrating step of applying the external stimulus to the liquid resin spread in the pressing step to cure the liquid resin, thereby integrating the first protective sheet bonded to the wafer, the liquid resin, and the second protective sheet with each other, in which the second protective sheet has surface irregularities ranging from Ra 0.2 to 7 µm on at least the surface thereof that faces the liquid resin.

In accordance with a still further aspect of the present invention, there is provided a method of laying a protective sheet on a face side of a wafer including a first protective sheet bonding step of bringing one surface of a first protective sheet free of an adhesive layer and the face side of the wafer into facing relation to each other and bringing the first protective sheet into close contact with the wafer while heating the first protective sheet, thereby integrating the first protective sheet and the wafer with each other, a liquid resin dropping step of preparing a second protective sheet free of an adhesive layer and dropping a liquid resin that can be cured by an external stimulus onto a surface of the second protective sheet, a pressing step of bringing another surface of the first protective sheet whose one surface has been bonded to the wafer into facing relation to the surface of the second protective sheet onto which the liquid resin has been dropped and moving the first protective sheet and the second protective sheet relatively closely to each other, thereby spreading the liquid resin over the second protective sheet, and an integrating step of applying the external stimulus to the liquid resin spread in the pressing step to cure the liquid resin, thereby integrating the first protective sheet bonded to the wafer, the liquid resin, and the second protective sheet with each other, in which the second protective sheet has surface irregularities ranging from Ra 0.2 to 7 µm on at least the surface thereof onto which the liquid resin is to be dropped.

Preferably, the integrating step includes applying active energy rays as the external stimulus to cure the liquid resin, thereby integrating the first protective sheet affixed to the wafer, the liquid resin, and the second protective sheet with each other.

Preferably, the method of laying a protective sheet further includes, after the integrating step, a cutting step of cutting the first protective sheet, the liquid resin, and the second protective sheet along an outer circumferential edge of the wafer.

Preferably, a protective sheet for use in protecting a wafer has surface irregularities ranging from Ra 0.2 to 7 µm on at least one surface thereof.

In accordance with a yet further aspect of the present invention, there is provided a protective sheet for use in protecting a face side of a wafer including a first protective sheet having one surface to be affixed or bonded to the face side of the wafer, a second protective sheet having, on at least one surface thereof, surface irregularities ranging from Ra 0.2 to 7 µm, and a cured resin layer interposed between another surface of the first protective sheet whose one surface has been affixed or bonded to the face side of the wafer and the one surface of the second protective sheet that has the surface irregularities, the cured resin layer being made of a liquid resin cured by an external stimulus applied thereto, in which the first protective sheet, the second protective sheet, and the cured resin layer are integrated with each other.

According to the present invention, it is possible to increase the surface accuracy of the reverse side of the wafer whose face side is protected by the protective sheet at the time the reverse side is ground.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 5 is a flowchart of the sequence of the method of laying a protective sheet according to the first embodiment;

FIG. 6 is a side elevational view, partly in cross section, illustrating a state in a first protective sheet affixing step of the sequence illustrated in FIG. 5;

DETAILED DESCRIPTION OF THE PREFERRED EMBODIMENTS

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described below. Furthermore, the arrangements described below can be combined in appropriate manners. Various omissions, replacements, or changes of the arrangements may be made without departing from the scope of the present invention. In the description below, those components that are identical to each other are denoted by identical reference signs.

First Embodiment

Figure 1:
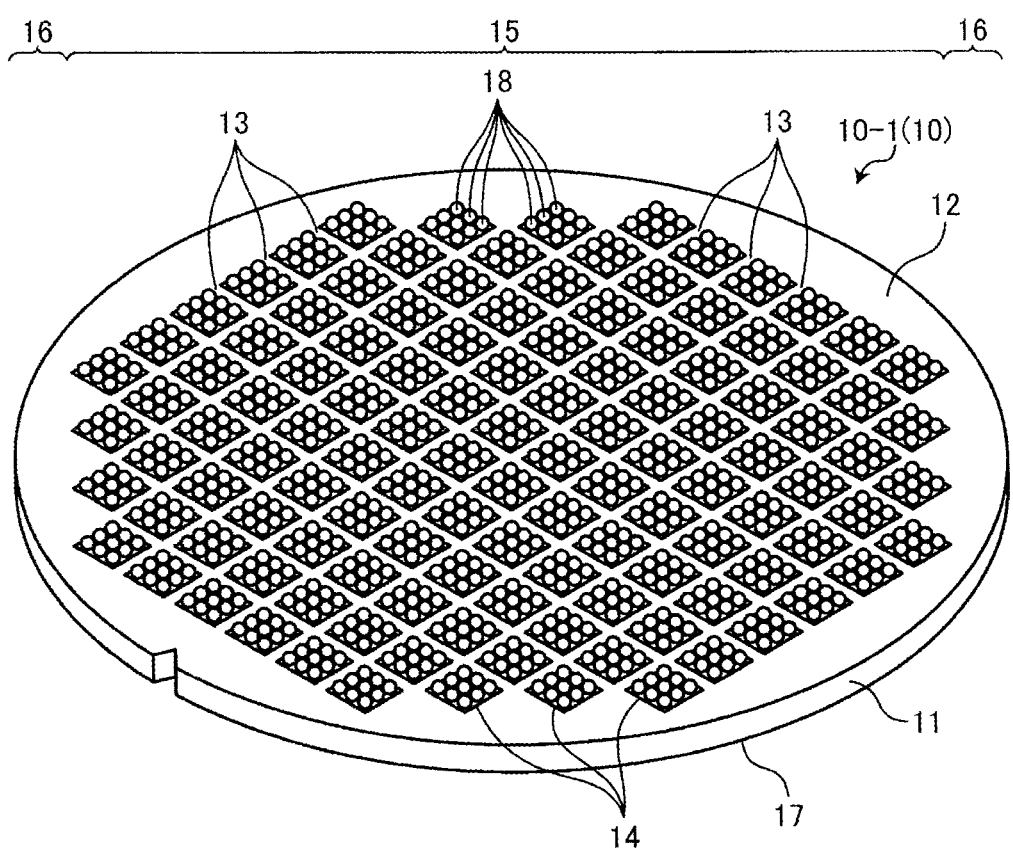
FIG. 1 is a perspective view of an example of a wafer to which a method of laying a protective sheet according to a first embodiment of the present invention is applicable.
Figure 2:
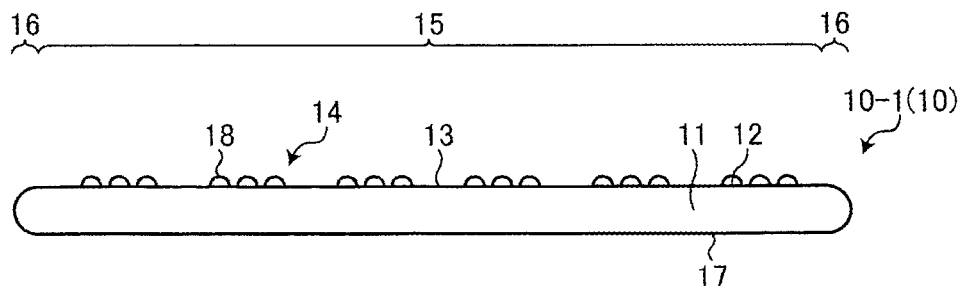
FIG. 2 is a side elevational view of the wafer illustrated in FIG. 1.
Figure 3:
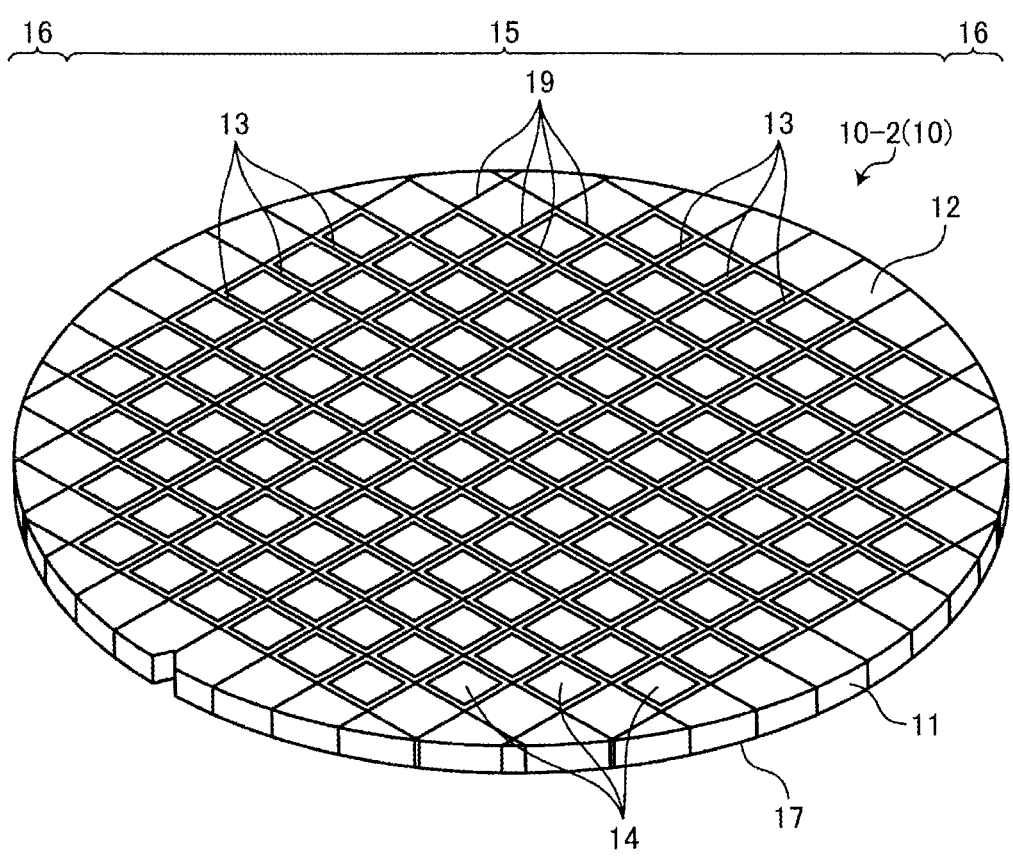
FIG. 3 is a perspective view of another example of the wafer to which the method of laying a protective sheet according to the first embodiment is applicable.
Figure 4:
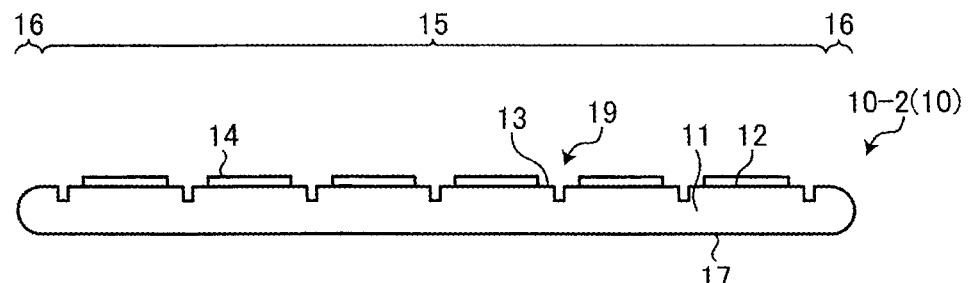
FIG. 4 is a side elevational view of the wafer illustrated in FIG. 3.

A method of laying a protective sheet and a protective sheet 20 according to a first embodiment of the present invention will be described below with reference to the drawings. First, a wafer 10 on which the protective sheet 20 is to be laid, i.e., to which the method of laying a protective sheet according to the first embodiment is applicable, will be described below. FIG. 1 illustrates, in perspective, an example of the wafer 10, i.e., a water 10-1, to which the method of laying a protective sheet according to the first embodiment is applicable. FIG. 2 illustrates, in side elevation, the wafer 10-1 illustrated in FIG. 1. FIG. 3 illustrates, in perspective, another example of the wafer 10, i.e., a wafer 10-2, to which the method of laying a protective sheet according to the first embodiment is applicable. FIG. 4 illustrates, in side elevation, the wafer 10-2 illustrated in FIG. 3.

The wafer 10 includes a wafer such as a semiconductor wafer made of a material such as silicon (Si), silicon carbide (SiC), gallium nitride (GaN), gallium arsenide (GaAs), or other semiconductors, or an optical device wafer, or a substrate substantially shaped as a circular plate made of sapphire (Al$_2$O$_3$), glass, or quartz. The glass includes, for example, alkali glass, alkali-free glass, soda-lime glass, lead glass, borosilicate glass, and quartz glass.

The wafer 10 includes a substrate 11 having a face side 12 that has a plurality of projected dicing lines 13 established in a grid pattern thereon and a plurality of devices 14 constructed in respective areas demarcated on the face side 12 by the projected dicing lines 13. The devices 14 include, for example, integrated circuits (ICs) or large-scale-integration (LSI) circuits, image sensors such as charge-coupled devices (CCDs) or complementary metal oxide semiconductors (CMOSs), or micro-electro-mechanical systems (MEMS).

The substrate 11 includes a central device region 15 where the devices 14 are present and an outer circumferential excessive region 16 surrounding the central device region 15 fully circumferentially and free of devices 14. The substrate 11 has a reverse side 17 opposite the face side 12. The reverse side 17 will be ground to thin down the substrate 11 to a finished thickness by a grinding apparatus, for example.

After the substrate 11 has been thinned down, for example, it will be divided along the projected dicing lines 13 as by cutting into individual device chips including the respective devices 14.

The wafer 10-1 illustrated in FIGS. 1 and 2 has a plurality of bumps 18 mounted on the face side 12 of the substrate 11 as protrusions protruding from the face sides of the devices 14. The protrusive bumps 18 are provided as surface irregularities on the face side 12 of the substrate 11. The bumps 18 are electrically connected to the devices 14. When the wafer 10-1 is divided into the device chips, the bumps 18 function as electrodes through which electric signals will be sent to and from the devices 14. The bumps 18 are made of a metal material such as gold, silver, copper, or aluminum, for example.

The wafer 10-2 illustrated in FIGS. 3 and 4 has a plurality of processed grooves 19 defined in the face side 12 of the substrate 11 respectively along the projected dicing lines 13. The processed grooves 19 are formed in the substrate 11 by, for example, a cutting process in which the cutting blade of a cutting apparatus cuts into the substrate 11 from the face side 12 thereof or a laser process in which a laser processing apparatus applies a laser beam to the face side 12.

The wafer 10 is not limited to the two examples referred to above, and may include a packaged substrate. The packaged substrate includes a plurality of devices arrayed on a plane that are encapsulated by an encapsulating resin and a plurality of pumps disposed on a face side thereof that will function as electrodes of the devices. The packaged substrate is thinned down by grinding the encapsulating resin on a reverse side thereof, and is then divided into individual device chips including the respective devices. The individual device chips are encapsulated by the encapsulating resin and have a predetermined thickness.

The wafer 10-1 has the surface irregularities provided on the face side 12 by the bumps 18. The wafer 10-2 also has surface irregularities provided on the face side 12 by the processed grooves 19. However, the method of laying a protective sheet and the protective sheet 20 according to the present invention are not only applicable to the wafers 10 having the bumps 18 and the processed grooves 19, but are also applicable to a wafer 10 having surface irregularities on a face side 12 thereof. In addition, the method of laying a protective sheet and the protective sheet 20 according to the present invention are also applicable to a wafer 10 that is free of surface irregularities on a face side 12 thereof. The method of laying a protective sheet will be described in detail below.

FIG. 5 is a flowchart of the sequence of the method of laying a protective sheet according to the first embodiment. As illustrated in FIG. 5, the method of laying a protective sheet according to the first embodiment includes first protective sheet preparing a step 101, a first protective sheet affixing step 102, a liquid resin dropping step 103, a pressing step 104, an integrating step 105, and a cutting step 106.
(First Protective Sheet Preparing Step 101 and First Protective Sheet Affixing Step 102)

FIG. 6 illustrates, in side elevation, partly in cross section, a state in the first protective sheet affixing step 102 of the sequence illustrated in FIG. 5. The first protective sheet preparing step 101 is a step of preparing a first protective sheet 21.

According to the first embodiment, the first protective sheet 21 has, on one surface thereof, a non-adhesive portion 22 coextensive with the central device region 15 of the substrate 11 and an adhesive portion 23 positioned around the non-adhesive portion 22 along and over the outer circumferential excessive region 16 of the substrate 11. The non-adhesive portion 22 is made of a non-adhesive and flexible resin and includes, for example, polyvinyl chloride (PVC), polyolefin (PO), polyethylene terephthalate (PET), or kapton. The adhesive portion 23 is made of an adhesive and flexible resin and includes, for example, an alkyl-based adhesive. According to the first embodiment, the first protective sheet 21 has only the non-adhesive portion 22 on the other surface thereof. The first protective sheet 21 is prepared by, for example, placing a layer having the non-adhesive portion 22 and the adhesive portion 23 on one surface of a base that is made of a non-adhesive and flexible resin.

The first protective sheet affixing step 102 is a step of affixing one surface of the first protective sheet 21 to the face side 12 of the wafer 10. In the first protective sheet affixing step 102 according to the first embodiment, the first protective sheet 21 is affixed to the wafer 10 using a pressing roller 30. The first protective sheet affixing step 102 is carried out in a vacuum environment.

In the first protective sheet affixing step 102, the reverse side 17 of the wafer 10, i.e., the substrate 11, is held on a holding table 31, and the surface of the first protective sheet 21 that has the adhesive portion 23 is brought into facing relation to the face side 12 of the wafer 10. Then, the non-adhesive portion 22 of the first protective sheet 21 is positioned over the device region 15 of the wafer 10, and the adhesive portion 23 is positioned over the outer circumferential excessive region 16 of the wafer 10, after which the first protective sheet 21 is placed on the face side 12 of the wafer 10.

Then, in the first protective sheet affixing step 102, the pressing roller 30 is rolled on the other surface of the first protective sheet 21 that is free of the adhesive portion 23 from one end to the other of the wafer 10, thereby affixing the first protective sheet 21 to the face side 12 of the wafer 10. More specifically, the adhesive portion 23 of the first protective sheet 21 is affixed to the outer circumferential excessive region 16 on the face side 12 of the wafer 10. At this time, since the first protective sheet 21 is affixed to the face side 12 of the wafer 10 in the vacuum environment, air bubbles are prevented from entering between the wafer 10 and the first protective sheet 21.

Prior to the first protective sheet affixing step 102, the first protective sheet 21 may be affixed to an annular frame. Then, the first protective sheet 21 secured to the annular frame may be affixed to the wafer 10. The annular frame is shaped as an annular plate made of metal or resin and having an opening that is larger in diameter than the diameter of the wafer 10. The first protective sheet 21 has a diameter larger than the outside diameter of the annular frame, and is affixed to a reverse side of the annular frame so as to cover the opening of the annular frame. The first protective sheet 21 as affixed to the annular frame in advance can easily be delivered and positioned with respect to the wafer 10.

In the first protective sheet affixing step 102, after the first protective sheet 21 has been affixed to the face side 12 of the wafer 10, at least one of the wafer 10 or the first protective sheet 21 is heated to increase the degree of adhesion of the first protective sheet 21 to the wafer 10. The wafer 10 and/or the first protective sheet 21 may be heated by delivering the wafer 10 to which the first protective sheet 21 has been affixed onto a heating table that is different from the holding table 31 and energizing the heating table to heat the wafer 10 and/or the first protective sheet 21, or supplying a heating fluid to the wafer 10 and/or the first protective sheet 21, or energizing a heating source that may be housed in the holding table 31.

(Liquid Resin Dropping Step 103)

Figure 7:
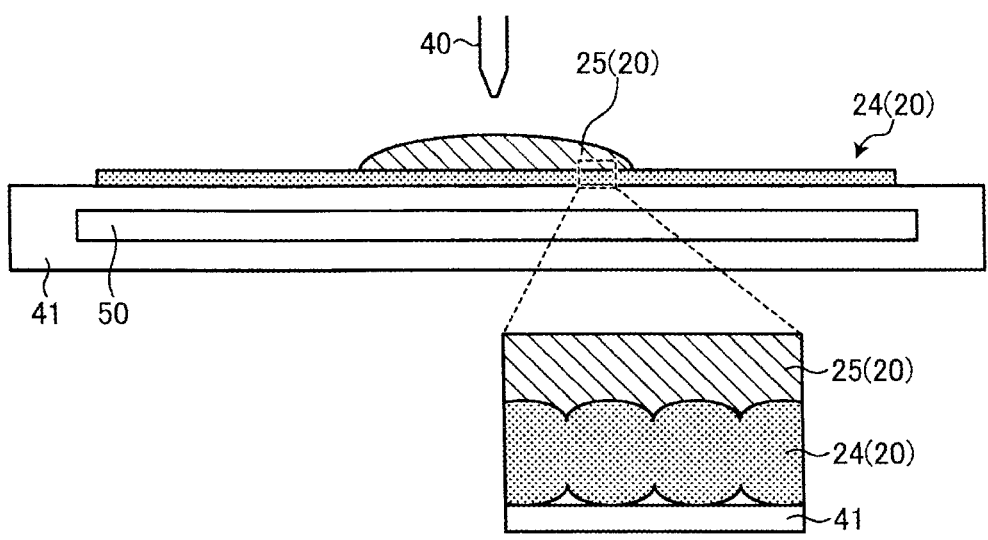
FIG. 7 is a side elevational view, partly in cross section, illustrating a state in a liquid resin dropping step of the sequence illustrated in FIG. 5.

FIG. 7 illustrates, in side elevation, partly in cross section, a state in the liquid resin dropping step 103 of the sequence illustrated in FIG. 5. According to the first embodiment, the liquid resin dropping step 103 is a step of preparing a second protective sheet 24 and dropping a liquid resin 25 that can be cured by an external stimulus onto the second protective sheet 24.

The second protective sheet 24 is free of an adhesive layer. The second protective sheet 24 is a sheet having only a base made of a thermoplastic resin that is non-adhesive and flexible. According to the first embodiment, the second protective sheet 24 is made of a material that is transmissive of, i.e., can transmit therethrough, active energy rays. According to the first embodiment, the active energy rays are ultraviolet rays. The second protective sheet 24 includes, for example, polyvinyl chloride (PVC), polyolefin (PO), polyethylene terephthalate (PET), or kapton.

The second protective sheet 24 has surface irregularities of peaks and valleys ranging from Ra 0.2 to 7 μm on at least the surface thereof onto which the liquid resin 25 is to be dropped. According to the first embodiment, the second protective sheet 24 has surface irregularities ranging from Ra 0.2 to 7 μm on both surfaces thereof. The second protective sheet 24 is fabricated by a known cast-molding process. Specifically, a roll having surface irregularities on its surface may be used to form surface irregularities on a film as it is molded into the second protective sheet 24, or alternatively, after a film has been molded into the second protective sheet 24, surface irregularities may be formed thereon by a subsequent process such as heating.

According to the first embodiment, the liquid resin 25 is a liquid resin that can be cured by ultraviolet rays applied as the external stimulus. According to the present invention, however, the external stimulus is not limited to ultraviolet rays. The liquid resin 25 is a liquid resin that can be cured by being heated. The liquid resin 25 may be, for example, ResiFlat (registered trademark) manufactured by DISCO Corporation or TEMPLOC (registered trademark) manufactured by Denka Company Limited.

In the liquid resin dropping step 103, while the surface of the second protective sheet 24 onto which the liquid resin 25 will not be dropped is being held on an upper holding surface of a holding table 41, the outlet port of a supply unit 40 for supplying the liquid resin 25 is positioned above the holding table 41 and then drops the liquid resin 25 onto the second protective sheet 24. The holding table 41 is made of a material such as glass that is transmissive of ultraviolet rays. The holding table 41 houses therein an ultraviolet ray applying unit 50 which will be used in the integrating step 105 to be described later.

The liquid resin 25 that has been dropped in the liquid resin dropping step 103 has its surface rounded on a central area of the second protective sheet 24 under surface tension. At this time, the surface of the second protective sheet 24 that is held in contact with the liquid resin 25 is well wet with the liquid resin 25 owing to the minute surface irregularities thereof, allowing the liquid resin 25 to enter the valleys of the surface irregularities, as depicted in an enlarged section in FIG. 7.

(Pressings Step 104)

Figure 8:
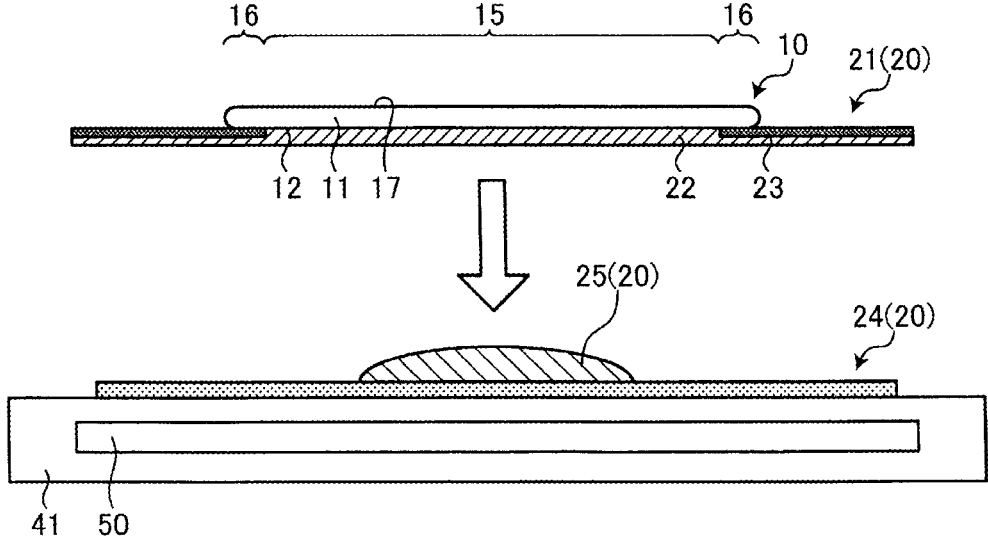
FIG. 8 is a side elevational view, partly in cross section, illustrating a state in a pressing step of the sequence illustrated in FIG. 5.

FIG. 8 illustrates, in side elevation, partly in cross section, a state in the pressing step 104 of the sequence illustrated in FIG. 5. According to the first embodiment, the pressing step 104 is a step of bringing the other surface of the first protective sheet 21 that has been affixed to the wafer 10 into facing relation to the surface of the second protective sheet 24 onto which the liquid resin 25 has been dropped and moving the first protective sheet 21 and the second protective sheet 24 relatively closely to each other, thereby spreading the liquid resin 25 over the second protective sheet 24.

In the pressing step 104, for example, a pressing unit, not depicted, that holds the reverse side 17 of the wafer 10 on a lower pressing surface and holds an outer edge portion of the first protective sheet 21 in a substantially horizontal posture may bring the wafer 10 and the first protective sheet 21 closer to the second protective sheet 24 on the holding table 41 and the liquid resin 25 on the second protective sheet 24. Alternatively, the holding table 41 may be lifted with respect to the pressing unit.

The liquid resin 25 that is sandwiched between the first protective sheet 21 and the second protective sheet 24 is pressed from above by the pressing surface of the pressing unit with the first protective sheet 21 interposed therebetween. The liquid resin 25 thus pressed is spread toward an outer circumferential edge of the wafer 10. In other words, the liquid resin 25 is forced to flow toward the outer circumferential edge of the wafer 10 between the first protective sheet 21 affixed to the wafer 10 and the second protective sheet 24 held on the holding table 41. Since the liquid resin 25 well wets the second protective sheet 24 due to the minute surface irregularities thereof, the liquid resin 25 is easily spread to an area that is larger in diameter than the wafer 10 while finding itself in the valleys of the surface irregularities.

(Integrating Step 105)

Figure 9:
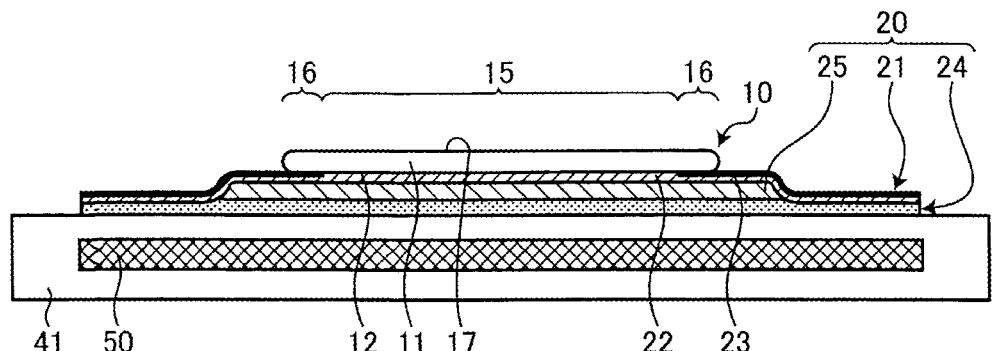
FIG. 9 is a side elevational view, partly in cross section, illustrating a state in an integrating step of the sequence illustrated in FIG. 5.

FIG. 9 illustrates, in side elevation, partly in cross section, a state in the integrating step 105 of the sequence illustrated in FIG. 5. According to the first embodiment, the integrating step 105 is a step of curing the liquid resin 25 spread in the pressing step 104 to integrate the first protective sheet 21 affixed to the wafer 10, the liquid resin 25, and the second protective sheet 24 with each other.

In the integrating step 105, an external stimulus is applied to the liquid resin 25, thereby curing the liquid resin 25. The external stimulus is in the form of active energy rays applied to the liquid resin 25, for example. The active energy rays include ultraviolet rays or an electron beam, for example. In the integrating step 105 according to the first embodiment, the ultraviolet ray applying unit 50 housed in the holding table 41 is energized to emit and apply ultraviolet rays to the liquid resin 25, thereby curing the liquid resin 25. The ultraviolet ray applying unit 50 includes a light source positioned closely to the holding surface of the holding table 41. The light source includes a plurality of ultraviolet light emitting diodes (LEDs), for example.

The ultraviolet rays emitted from the ultraviolet ray applying unit 50 are transmitted through the second protective sheet 24 held on the holding table 41 and applied to the liquid resin 25. When the liquid resin 25 is cured by the ultraviolet rays applied thereto, the first protective sheet 21, the liquid resin 25, and the second protective sheet 24 are integrated with each other, making up a protective sheet 20.

Inasmuch as the liquid resin 25 as it is sufficiently spread is integrated with the first protective sheet 21 and the second protective sheet 24, the liquid resin 25 prevents resin-unfilled regions or voids from being developed in the protective sheet 20. In addition, since the surface of the second protective sheet 24 of the protective sheet 20 that is held in contact with the holding table 41 has surface irregularities according to the first embodiment, it is easy to peel off the protective sheet 20 from the holding table 41.

(Cutting Step 106)

Figure 10:
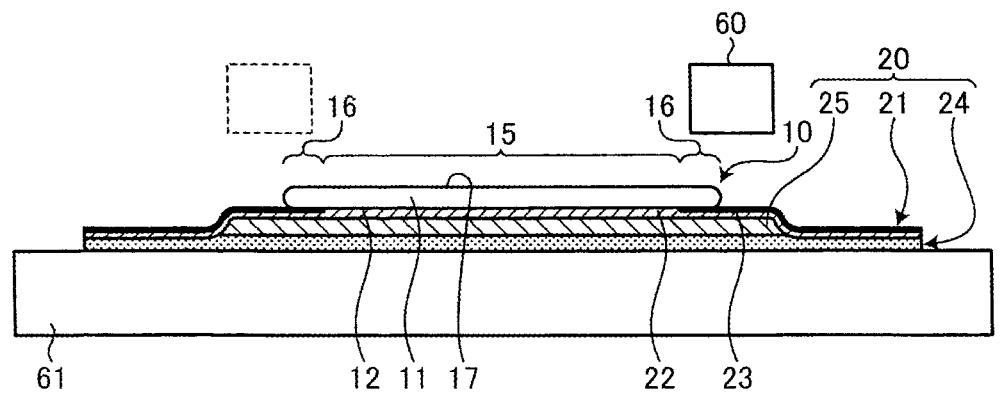
FIG. 10 is a side elevational view, partly in cross section, illustrating a state in a cutting step of the sequence illustrated in FIG. 5.
Figure 11:
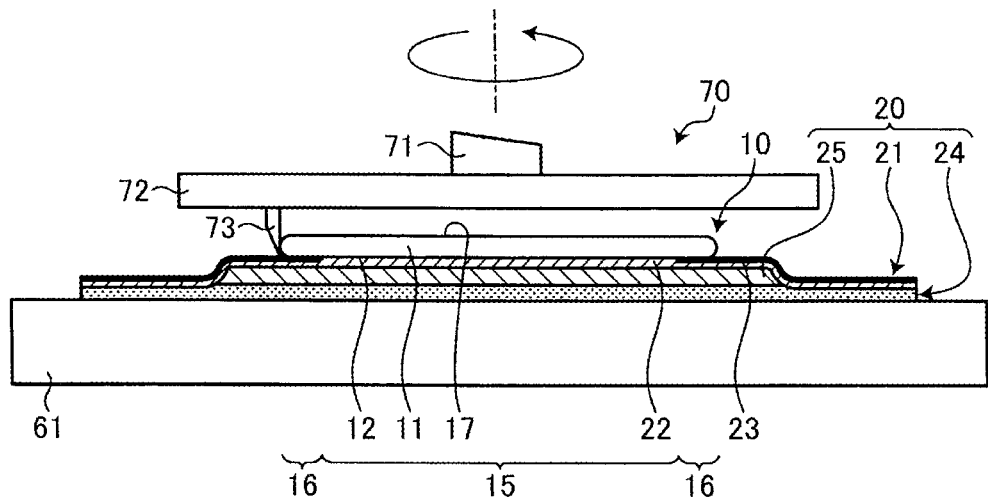
FIG. 11 is a side elevational view, partly in cross section, illustrating another state in the cutting step of the sequence illustrated in FIG. 5.

FIGS. 10 and 11 illustrate, in side elevation, partly in cross section, states in the cutting step 106 of the sequence illustrated in FIG. 5. The cutting step 106 according to the first embodiment is a step of cutting the first protective sheet 21, the cured liquid resin 25, and the second protective sheet 24 along the outer circumferential edge of the wafer 10.

In the cutting step 106 according to the first embodiment, after the position where the protective sheet 20 is to be cut is adjusted, using a captured image of the wafer 10, by an image capturing unit 60 illustrated in FIG. 10, a cutting unit 70 illustrated in FIG. 11 cuts off an unwanted portion of the protective sheet 20 that lies outwardly of the outer circumferential edge of the wafer 10. The image capturing unit 60 can capture an image of the wafer 10 held on a holding table 61, as illustrated in FIG. 10. As illustrated in FIG. 11, the cutting unit 70 includes a rotary shaft 71, a rotary base 72 fixed to the lower end of the rotary shaft 71, and a cutter blade 73 mounted on a lower surface of the rotary base 72. The cutting unit 70 can be lifted away from and lowered toward the holding table 61. The cutter blade 73 is movable radially with respect to the rotary base 72.

In the cutting step 106, the face side 12 of the wafer 10 is held on an upper holding surface of a holding table 61 with the protective sheet 20 interposed therebetween. Then, the image capturing unit 60 (see FIG. 10) captures an image of the wafer 10 to detect the outer circumferential edge of the wafer 10. Using the detected outer circumferential edge of the wafer 10, an alignment process is performed to align the center of the wafer 10 and the central axis of the rotary shaft 71 of the cutting unit 70 (see FIG. 11) with each other and also align the outer circumferential edge of the wafer 10 and the cutter blade 73 with each other.

Then, the cutting unit 70 is lowered toward the holding table 61 until the cutter blade 73 cuts into the protective sheet 20 from the first protective sheet 21 that lies outwardly of the outer circumferential edge of the wafer 10. Then, the rotary shaft 71 is rotated about its central axis to make at least one revolution, cutting off unwanted portions of the first protective sheet 21, the cured liquid resin 25, and the second protective sheet 24, i.e., an unwanted portion of the protective sheet 20, along the outer circumferential edge of the wafer 10. After the unwanted portion of the protective sheet 20 has been cut off, a grinding process can be performed to grind the reverse side 17, for example, of the wafer 10 with the protective sheet 20 affixed to the face side 12 thereof.

Second Embodiment

Figure 12:
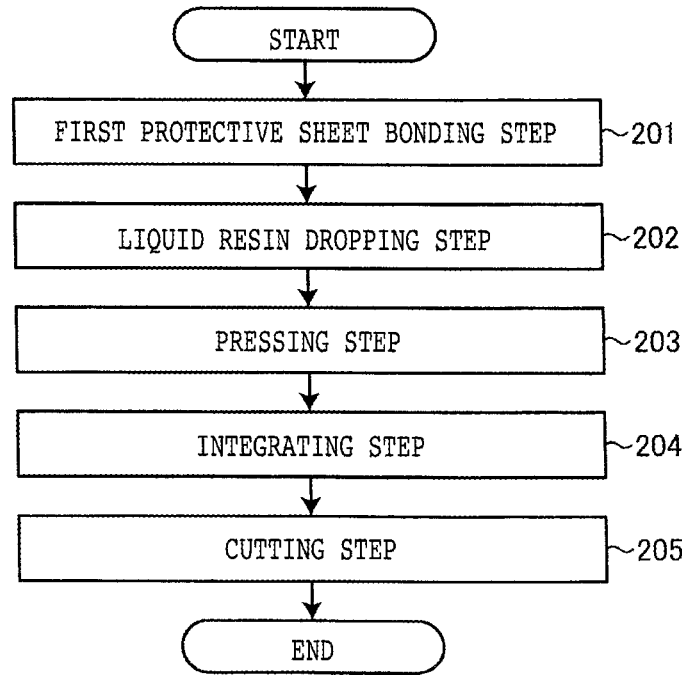
FIG. 12 is a flowchart of the sequence of a method of laying a protective sheet according to a second embodiment of the present invention.

A method of laying a protective sheet and a protective sheet 26 according to a second embodiment of the present invention will be described below with reference to the drawings. FIG. 12 is a flowchart of the sequence of the method of laying a protective sheet according to the second embodiment. As illustrated in FIG. 12, the method of laying a protective sheet according to the second embodiment includes a first protective sheet bonding step 201, a liquid resin dropping step 202, a pressing step 203, an integrating step 204, and a cutting step 205.

(First Protective Sheet Bonding Step 201)

Figure 13:
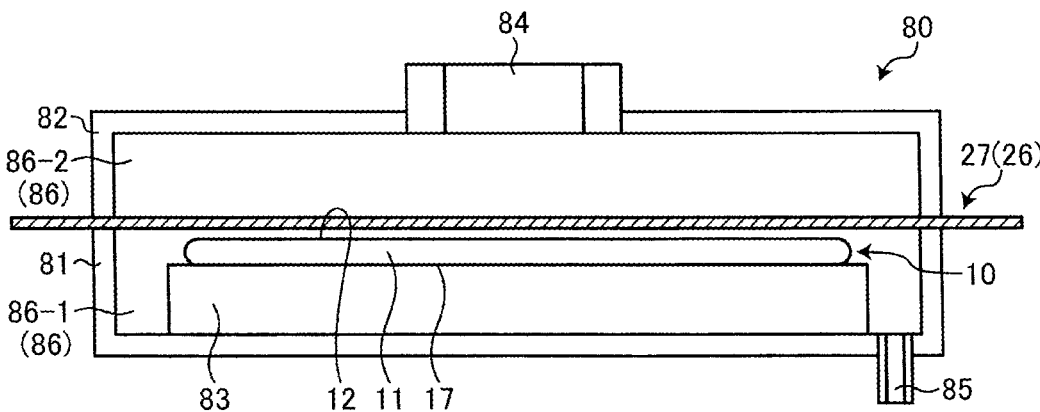
FIG. 13 is a side elevational view, partly in cross section, illustrating a state in a first protective sheet bonding step of the sequence illustrated in FIG. 12.
Figure 14:
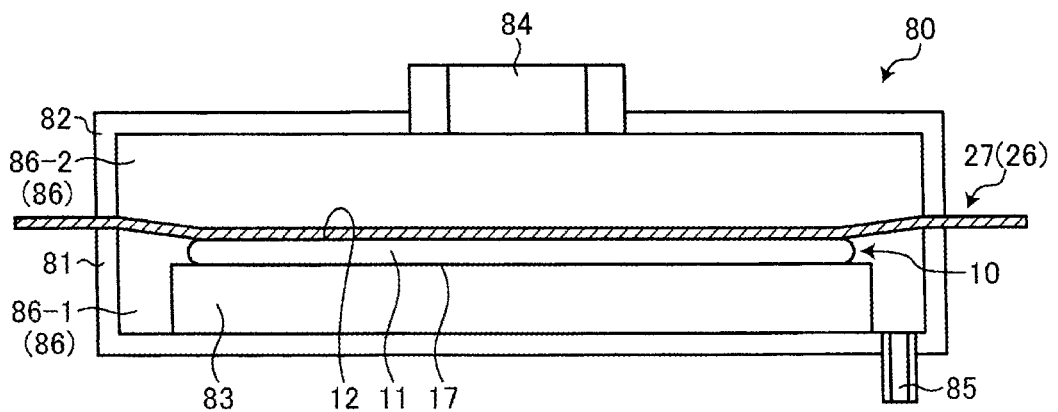
FIG. 14 is a side elevational view, partly in cross section, illustrating another state in the first protective sheet bonding step of the sequence illustrated in FIG. 12.

FIGS. 13 and 14 illustrate, in side elevation, partly in cross section, states in the first protective sheet bonding step 201 of the sequence illustrated in FIG. 12. The first protective sheet bonding step 201 is a step of bringing one surface of a first protective sheet 27 and the face side 12 of the wafer 10 into facing relation to each other, and heating and holding the first protective sheet 27 into contact with the wafer 10, thereby integrating the first protective sheet 27 and the wafer 10 with each other.

The first protective sheet 27 is free of an adhesive layer. The first protective sheet 27 is made of a thermoplastic resin that is non-adhesive and flexible. For example, the first protective sheet 27 is made of one or two or more selected from acrylic resin, methacrylic resin, vinyl-based resin, polyacetal, natural rubber, butyl rubber, isoprene rubber, chloroprene rubber, polyethylene, polypropylene, polyolefin such as poly(4-methyl-1-pentene) or poly(1-butene), polyester such as polyethylene terephthalate or polybutylene terephthalate, polyamide such as nylon-6, nylon-66, or polymethaxylene adipamide, polyacrylate, polymethacrylate, polyvinyl chloride, polyetherimide, polyacrylonitrile, polycarbonate, polystyrene, polysulfone, polyethersulfone, polyphenylene, ether polybutadiene resin, polycarbonate resin, thermoplastic polyimide resin, thermoplastic polyurethane resin, phenoxy resin, polyamide-imide resin, fluororesin, ethylene-unsaturated carboxylic acid copolymer resin, ethylene-vinyl acetate copolymer resin, ionomer, ethylene-vinyl acetate-maleic anhydride ternary copolymer resin, saponified ethylene-vinyl acetate copolymer resin, or ethylene-vinyl alcohol copolymer resin. The first protective sheet 27 is, for example, a sheet of GluFree (registered trademark) manufactured by DISCO Corporation.

In the first protective sheet bonding step 201 according to the second embodiment, the first protective sheet 27 is fixed to the face side 12 of the wafer 10 in a chamber 80 whose internal space can be evacuated. The chamber 80 has a lower casing 81 and an upper casing 82. The chamber 80 houses therein a table 83 that is disposed in the lower casing 81. The chamber 80 is connected to an air discharge passage 84 mounted on a ceiling panel of the upper casing 82. The chamber 80 is also connected to an air discharge passage 85 mounted on a bottom panel of the lower casing 81.

The lower casing 81 includes an upwardly open recessed box, whereas the upper casing 82 includes a downwardly open recessed box disposed over the lower casing 81. The upward opening of the lower casing 81 and the downward opening of the upper casing 82 are identical in shape to each other and is larger than the wafer 10. The upper casing 82 has a suction unit on its lower end. The suction unit can attract and hold an upper surface of the first protective sheet 27 under suction. The upper casing 82 can be lifted away from and lowered toward the lower casing 81. When the upper casing 82 is lowered to have its downward opening aligned with and positioned over the upward opening of the lower casing 81, the lower casing 81 and the upper casing 82 jointly define therein a space 86 that is isolated from outside of the chamber 80. The lower casing 81 and the upper casing 82 can accommodate the wafer 10 in the space 86 jointly defined therein.

The table 83 is mounted on the bottom panel of the lower casing 81. The table 83 has a flat upper holding surface for supporting the wafer 10 thereon. The table 83 on the bottom panel of the lower casing 81 is of such a height that, when the wafer 10 is placed on the holding surface of the table 83, the upper surface, i.e., the face side 12, of the wafer 10 is lower than the downward opening of the upper casing 82, as illustrated in FIG. 14. When the first protective sheet 27 is placed on the lower casing 81 and brought into intimate contact with the wafer 10, as described later, the table 83 having such a height is effective to prevent the first protective sheet 27 from unnecessarily contacting the side surface of the wafer 10. The table 83 houses therein a heat source for heating the wafer 10 placed on the table 83 through the holding surface thereof and hence heating the first protective sheet 27 covering the wafer 10 through the wafer 10.

The air discharge passage 84 is joined to the ceiling panel, or a side wall, of the upper casing 82. The air discharge passage 84 is fluidly connected to an evacuating unit, not depicted. When the evacuating unit is actuated, it evacuates the space 86 through the air discharge passage 84 as long as the space 86 is defined jointly by the lower casing 81 and the upper casing 82.

The air discharge passage 85 is joined to the bottom panel, or a side wall, of the lower casing 81. The air discharge passage 85 is fluidly connected to an evacuating unit, not depicted. When the evacuating unit is actuated, it evacuates the space 86 through the air discharge passage 85 as long as the space 86 is defined jointly by the lower casing 81 and the upper casing 82.

At least one of the air discharge passage 84 or the air discharge passage 85 may be fluidly connected to a heating fluid supply unit, not depicted. The heating fluid supply unit supplies the wafer 10 on the table 83 and the first protective sheet 27 with a heating fluid through the air discharge passage 84 and/or the air discharge passage 85. The heating fluid is gas such as air or a nitrogen gas that has been heated to heat the first protective sheet 27, for example, to its softening point or higher. The heating fluid supply unit may be provided separately from the air discharge passage 84 and the air discharge passage 85, and may have a heating fluid supply port that can be closed when the space 86 is evacuated. The heating fluid supply unit may be mounted on the ceiling panel or side wall of the upper casing 82 or the bottom panel or side wall of the lower casing 81.

In the first protective sheet bonding step 201 illustrated in FIG. 13, the upper casing 82 of the chamber 80 is lifted away from the lower casing 81, and the wafer 10 is delivered onto the holding surface of the table 83. At this time, the wafer 10 is placed on the table 83 such that the surface of the wafer 10 to which the first protective sheet 27 is to be affixed faces upwardly. According to the second embodiment, the face side 12 of the wafer 10 faces upwardly, whereas the reverse side 17 thereof is held in contact with the holding surface.

Then, one first protective sheet 27 is taken from a sheet supply mechanism, not depicted, disposed adjacent to the chamber 80 by a delivery mechanism, not depicted, and placed on the lower casing 81 in covering relation to the face side 12 of the wafer 10. The first protective sheet 27 now closes the upward opening of the lower casing 81, whereupon the lower casing 81 and the first protective sheet 27 that covers the wafer 10 jointly make up a closed space 86-1.

Then, the upper casing 82 is lowered toward and placed on the lower casing 81 with the first protective sheet 27 interposed therebetween. The suction unit on the lower end of the upper casing 82 is actuated to attract and hold the upper surface of the first protective sheet 27 under suction. The lower end of the upper casing 82 is held in contact with the upper surface of the first protective sheet 27, and the downward opening of the upper casing 27 is closed by the first protective sheet 27. The upper casing 82 and the first protective sheet 27 that covers the wafer 10 jointly make up a closed space 86-2. As illustrated in FIG. 13, the first protective sheet 27 divides the space 86 into the space 86-1 in the lower casing 81 and the space 86-2 in the upper casing 82.

Then, the evacuating unit fluidly connected to the air discharge passage 85 is actuated to evacuate the space 86-1 surrounded by the lower casing 81 and the first protective sheet 27. At the same time, the evacuating unit fluidly connected to the air discharge passage 84 is actuated to evacuate the space 86-2 surrounded by the upper casing 82 and the first protective sheet 27. It is preferable to evacuate the spaces 86-1 and 86-2 to a pressure ranging from $10^5$ to $10^1$ Pa. Then, the evacuating unit fluidly connected to the air discharge passage 84 is shut off, after which the space 86-2 is vented to the atmosphere. At this time, since a quick pressure difference is developed across the first protective sheet 27, the first protective sheet 27 has its lower surface brought into intimate contact with the face side 12 of the wafer 10, closely conforming to the surface irregularities of the face side 12.

Then, the heat source in the table 83 is energized to heat the wafer 10 placed on the table 83 through the holding surface thereof and hence heat the first protective sheet 27 through the wafer 10. Alternatively, the wafer 10 may be heated before the space 86-2 is evacuated. In the first protective sheet bonding step 201, the first protective sheet 27 may be heated by the heating fluid supplied from the heating fluid supply unit to at least one of the space 86-2 or 86-1. Alternatively, the first protective sheet 27 may be heated by the heating fluid supplied from the heating fluid supply unit to at least one of the space 86-2 or 86-1 before the space 86-2 is evacuated. In the first protective sheet bonding step 201, the first protective sheet 27 is heated to a temperature in the range from its softening point to its melting point.

The first protective sheet 27 is softened when it is heated. Therefore, it is easy for the first protective sheet 27 to conform to the surface irregularities of the face side 12 of the wafer 10 and to be brought into intimate contact with, i.e., to be bonded to, the face side 12 of the wafer 10. After the first protective sheet 27 has been bonded to the face side 12 of the wafer 10, the evacuating unit fluidly connected to the air discharge passage 85 is shut off, and the upper casing 82 is lifted away from the lower casing 81. The wafer 10 with the first protective sheet 27 bonded thereto is delivered out of the chamber 80 by the delivery mechanism, not depicted.

(Liquid Resin Dropping Step 202)

Figure 15:
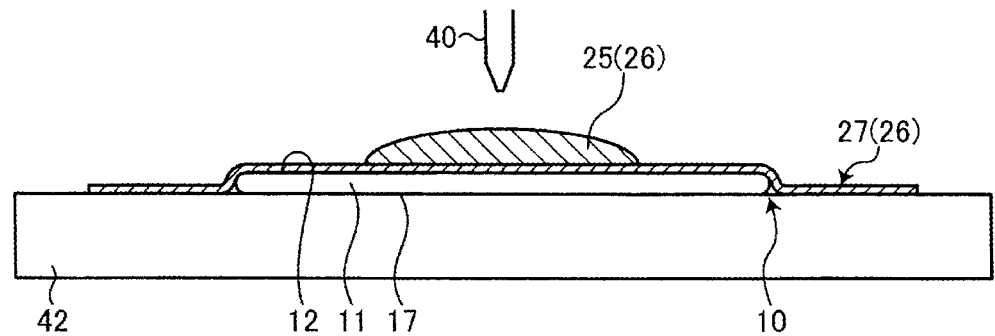
FIG. 15 is a side elevational view, partly in cross section, illustrating a state in a liquid resin dropping step of the sequence illustrated in FIG. 12.

FIG. 15 illustrates, in side elevation, partly in cross section, a state in the liquid resin dropping step 202 of the sequence illustrated in FIG. 12. According to the second embodiment, the liquid resin dropping step 202 is a step of dropping the liquid resin 25 that can be cured by an external stimulus onto the upper surface of the first protective sheet 27 whose lower surface has been bonded to the wafer 10.

In the liquid resin dropping step 202, while the reverse side 17 of the wafer 10 is being held on an upper holding surface of a holding table 42, the outlet port of the supply unit 40 for supplying the liquid resin 25 is positioned above the holding table 42 and then drops the liquid resin 25 onto the first protective sheet 27. The liquid resin 25 that has been dropped in the liquid resin dropping step 202 has its surface rounded on a central area of the first protective sheet 27 under surface tension.

(Pressing Step 203)

Figure 16:
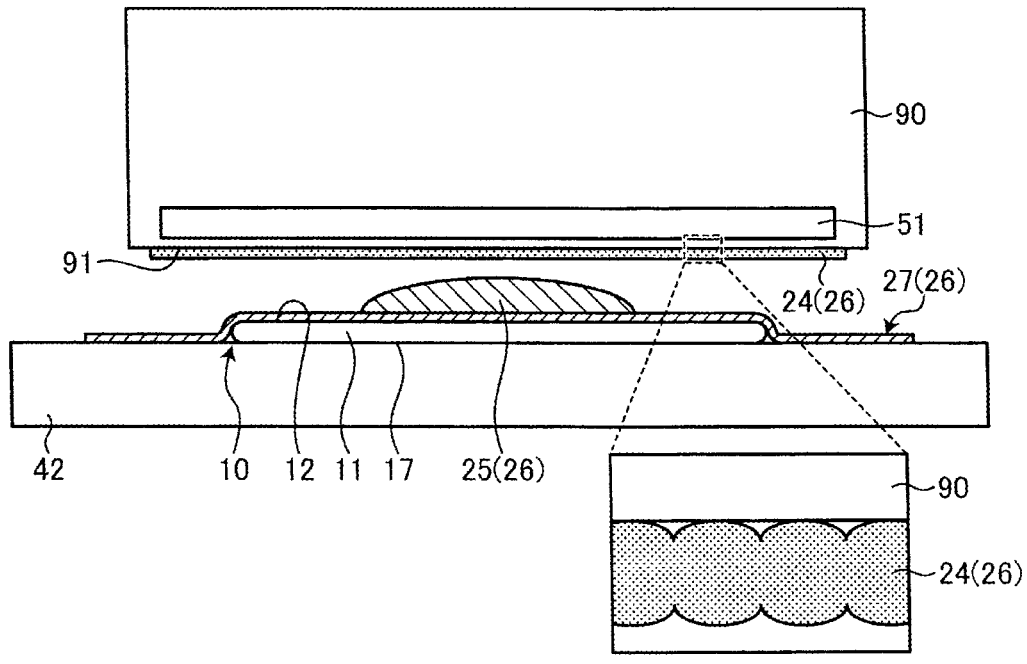
FIG. 16 is a side elevational view, partly in cross section, illustrating a state in a pressing step of the sequence illustrated in FIG. 12.

FIG. 16 illustrates, in side elevation, partly in cross section, a state in the pressing step 203 of the sequence illustrated in FIG. 12. According to the second embodiment, the pressing step 203 is a step of bringing a second protective sheet 24 with no adhesive layer into facing relation to the upper surface of the first protective sheet 27 onto which the liquid resin 25 has been dropped, and moving the first protective sheet 27 and the second protective sheet 24 relatively closely to each other, thereby spreading the liquid resin 25 over the first protective sheet 27.

The second protective sheet 24 used in the pressing step 203 is the same as the second protective sheet 24 used according to the first embodiment, and has surface irregularities of peaks and valleys ranging from Ra 0.2 to 7 μm on its both surfaces. However, if the second protective sheet 24 has surface irregularities on only one of the surfaces thereof, the surface with the surface irregularities is brought into facing relation to the liquid resin 25.

The pressing step 203 according to the second embodiment is carried out by a pressing unit 90 illustrated in FIG. 16. As illustrated in FIG. 16, the pressing unit 90 is disposed above the holding table 42 and vertically movable relatively to the holding table 42, i.e., movable toward and away from the holding table 42. The pressing unit 90 is made of a material such as glass that is transmissive of ultraviolet rays. The pressing unit 90 houses therein an ultraviolet ray applying unit 51 which will be used in the integrating step 204 to be described later.

The pressing unit 90 has a flat lower horizontal pressing surface 91. The pressing surface 91 is oriented highly accurately so as to lie parallel to the upper holding surface of the holding table 42. The pressing surface 91 can hold the second protective sheet 24 thereon. The pressing surface 91 has a holding mechanism, not depicted, for holding the second protective sheet 24 on the pressing surface 91. The holding mechanism includes, for example, suction holes defined in the pressing surface 91 and a suction source fluidly connected to the suction holes. When the suction source is actuated, it generates and apply a suction force, e.g., a vacuum, through the suction holes to attract and hold the second protective sheet 24 on the pressing surface 91. The holding mechanism may alternatively include, for example, an electrostatic chuck mechanism disposed near the pressing surface 91 for holding the second protective sheet 24 on the pressing surface 91 under an electrostatic force.

In the pressing step 203, the pressing unit 90 is lowered closer to the holding table 42 to cause the second protective sheet 24 held on the pressing surface 91 to press the liquid resin 25 on the first protective sheet 27 from above. The liquid resin 25 thus pressed is spread over the first protective sheet 27 toward the outer circumferential edge of the wafer 10. In other words, the liquid resin 25 is forced to flow toward the outer circumferential edge of the wafer 10 between the second protective sheet 24 held on the flat pressing surface 91 and the first protective sheet 27 bonded to the face side 12 of the wafer 10. Since the liquid resin 25 well wets the second protective sheet 24 due to the minute surface irregularities thereof, the liquid resin 25 is easily spread to an area that is larger in diameter than the wafer 10 while entering the valleys of the surface irregularities.

(Integrating Step 204)

Figure 17:
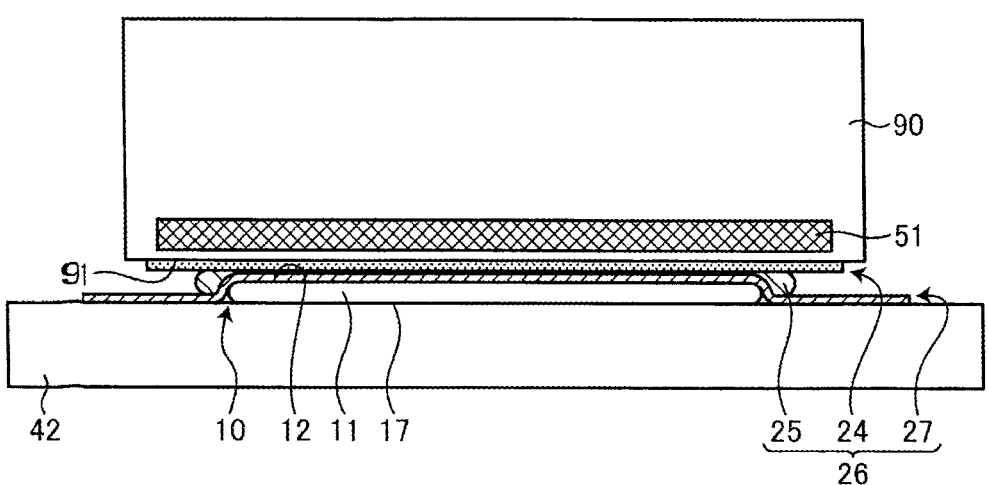
FIG. 17 is a side elevational view, partly in cross section, illustrating a state in an integrating step of the sequence illustrated in FIG. 12.

FIG. 17 illustrates, in side elevation, partly in cross section, a state in the integrating step 204 of the sequence illustrated in FIG. 12. The integrating step 204 is a step of curing the liquid resin 25 spread in the pressing step 203 to integrate the first protective sheet 27 bonded to the wafer 10, the liquid resin 25, and the second protective sheet 24 with each other.

In the integrating step 204 according to the second embodiment, as with the integrating step 105 according to the first embodiment, an external stimulus is applied to the liquid resin 25, thereby curing the liquid resin 25. The external stimulus is in the form of ultraviolet rays as with the first embodiment. In the integrating step 204 according to the second embodiment, the ultraviolet ray applying unit 51 housed in the pressing unit 90 applies ultraviolet rays to the liquid resin 25, curing the liquid resin 25. The ultraviolet ray applying unit 51 includes a light source positioned closely to the pressing surface 91. The light source includes a plurality of ultraviolet LEDs, for example.

The ultraviolet rays emitted from the ultraviolet ray applying unit 51 are transmitted through the pressing unit 90 and the second protective sheet 24 held on the pressing surface 91 of the pressing unit 90 and are applied to the liquid resin 25. When the liquid resin 25 is cured by the ultraviolet rays applied thereto, the first protective sheet 27, the liquid resin 25, and the second protective sheet 24 are integrated with each other, making up a protective sheet 26.

Inasmuch as the liquid resin 25 as it is sufficiently spread is integrated with the first protective sheet 27 and the second protective sheet 24, the liquid resin 25 prevents resin-unfilled regions from being developed in the protective sheet 26. In addition, since the surface of the second protective sheet 24 of the protective sheet 26 that is held in contact with the pressing surface 91 of the pressing unit 90 has surface irregularities according to the second embodiment, it is easy to peel off the protective sheet 26 from the pressing surface 91.

(Cutting Step 205)

Figure 18:
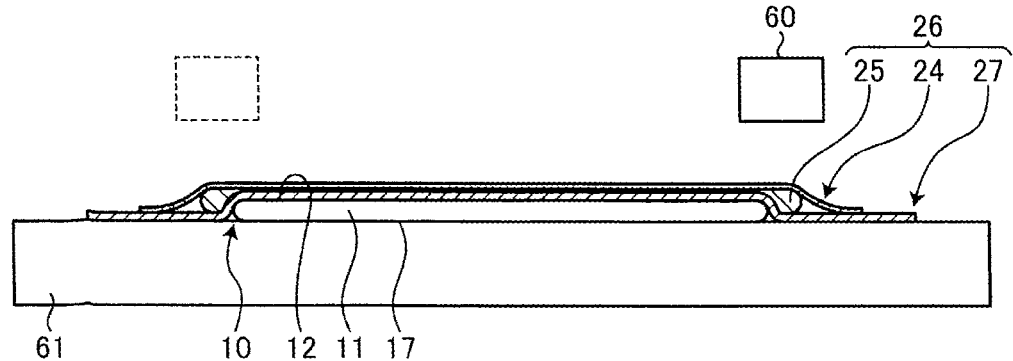
FIG. 18 is a side elevational view, partly in cross section, illustrating a state in a cutting step of the sequence illustrated in FIG. 12.
Figure 19:
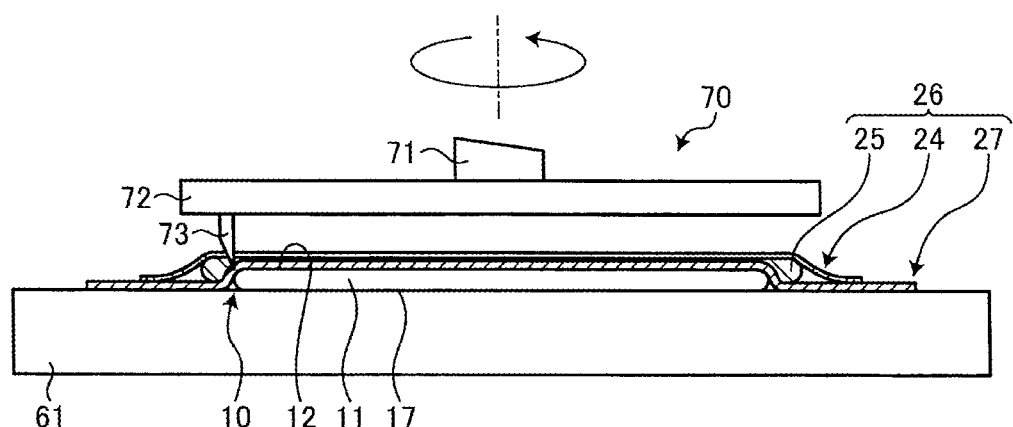
FIG. 19 is a side elevational view, partly in cross section, illustrating another state in the cutting step of the sequence illustrated in FIG. 12.

FIGS. 18 and 19 illustrate, in side elevation, partly in cross section, the states in cutting step 205 of the sequence illustrated in FIG. 12. The cutting step 205 according to the second embodiment is a step of cutting the first protective sheet 27, the cured liquid resin 25, and the second protective sheet 24 along the outer circumferential edge of the wafer 10, as with the cutting step 106 according to the first embodiment.

In the cutting step 205 according to the second embodiment, after the position where the protective sheet 26 is to be cut is adjusted using an image captured of the wafer 10 by an image capturing unit 60 illustrated in FIG. 18, a cutting unit 70 illustrated in FIG. 19 cuts off an unwanted portion of the protective sheet 26 that lies outwardly of the outer circumferential edge of the wafer 10. The image capturing unit 60 and the cutting unit 70 are identical in structure to the image capturing unit 60 and the cutting unit 70 illustrated in FIGS. 10 and 11 according to the first embodiment, and will be omitted from detailed description below.

A holding table 61 illustrated in FIGS. 18 and 19 that is disposed below the image capturing unit 60 and the cutting unit 70 in facing relation thereto in the cutting step 205 according to the second embodiment may be the same as the holding table 42 illustrated in FIGS. 15 through 17. Specifically, the wafer 10 and the protective sheet 26 that has been integrated with the face side 12 of the wafer 10 by the pressing unit 90 and the ultraviolet ray applying unit 51 may be held on the holding table 61 and delivered to a position below the image capturing unit 60 and the cutting unit 70. Alternatively, the image capturing unit 60 and the cutting unit 70 may be movable to a position above the holding table 61.

The cutting step 205 according to the second embodiment is similar to the cutting step 106 according to the first embodiment except that the reverse side 17 of the wafer 10 is held on the holding table 61 and the cutter blade 73 cuts into the protective sheet 26 from the second protective sheet 24. Therefore, the cutting step 205 according to the second embodiment will be omitted from detailed description below.

Other Embodiments

Some of the steps of the method of laying the protective sheet 20 according to the first embodiment described above and the method of laying the protective sheet 26 according to the second embodiment may be replaced with each other.

Specifically, for example, after the first protective sheet preparing step 101 and the first protective sheet affixing step 102 according to the first embodiment have been carried out, the liquid resin dropping step 202, the pressing step 203, the integrating step 204, and the cutting step 205 may be carried out in the same sequence as with the second embodiment. In other words, the first protective sheet 21 having the non-adhesive portion 22 and the adhesive portion 23 is employed, and the liquid resin 25 that can be cured by an external stimulus is dropped onto the surface of the first protective sheet 21 opposite the surface thereof that is affixed to the wafer 10 in the liquid resin dropping step 202. In the pressing step 203, the second protective sheet 24 is brought into facing relation to the surface of the first protective sheet 21 opposite the surface thereof that is affixed to the wafer 10, and the first protective sheet 21 and the second protective sheet 24 are brought relatively closely to each other, spreading the liquid resin 25 over the first protective sheet 21.

Furthermore, for example, after the first protective sheet bonding step 201 according to the second embodiment has been carried out, the liquid resin dropping step 103, the pressing step 104, the integrating step 105, and the cutting step 106 may be carried out in the same sequence as with the first embodiment. In other words, the first protective sheet 27 with no adhesive layer is employed, and the liquid resin 25 that can be cured by an external stimulus is dropped onto the second protective sheet 24 in the liquid resin dropping step 103. In the pressing step 104, the surface of the first protective sheet 27 opposite the surface thereof that is affixed to the wafer 10 is brought into facing relation to the surface of the second protective sheet 24 onto which the liquid resin 25 has been dropped, and the first protective sheet 27 and the second protective sheet 24 are brought relatively closely to each other, spreading the liquid resin 25 over the second protective sheet 24.

In the method of laying a protective sheet according to the present invention, as described above, the first protective sheet 21 having the adhesive portion 23 to be positioned over the outer circumferential excessive region 16 of the wafer 10 or the first protective sheet 27 with no adhesive layer may be used as the first protective sheet 21 or 27 to be affixed or bonded to the face side 12 of the wafer 10. In the liquid resin dropping step 103 or 202, the liquid resin 25 may be dropped onto either the first protective sheet 21 or 27 or the second protective sheet 24.

Moreover, for example, in the first protective sheet affixing step 102 according to the first embodiment, as a process of affixing the first protective sheet 21 having the non-adhesive portion 22 and the adhesive portion 23 to the face side 12 of the wafer 10, the first protective sheet bonding step 201 according to the second embodiment may be carried out using the chamber 80 illustrated in FIGS. 13 and 14, rather than the pressing roller 30.

Moreover, for example, in the first protective sheet bonding step 201 according to the second embodiment, as a process of affixing the first protective sheet 27 with no adhesive layer to the face side 12 of the wafer 10, the first protective sheet affixing step 102 according to the first embodiment may be carried out using the pressing roller 30 illustrated in FIG. 6, rather than the chamber 80. In this case, the pressing roller 30 and the holding table 31 have respective heat sources housed therein, and bond the first protective sheet 27 that has been heated and softened to the wafer 10.

As described above, in the methods of laying the protective sheets 20 or 26 according to the respective embodiments, for laying the protective sheet 20 or 26 on the wafer 10, there is used a base film, i.e., the second protective sheet 24, having minute surface irregularities formed on the surface thereof that faces at least the liquid resin 25. Since the minute surface irregularities improve the manner in which the liquid resin 25 wets and is spread on the second protective sheet 24, resin-unfilled regions are not likely to occur, making it possible to prevent a reduction in the surface accuracy when the wafer 10 is ground. In addition, as the time required for the liquid resin 25 to wet and be spread on the second protective sheet 24 is shortened, the second protective sheet 24 contributes to an increase in productivity.

The protective sheet, i.e., the second protective sheet 24, according to each of the embodiments has surface irregularities of peaks and valleys ranging from Ra 0.2 to 7 μm on at least one of the surfaces thereof. If the surface roughness is smaller than Ra 0.2 μm, it is difficult to spread the liquid resin 25 easily to the outer circumferential edge of the wafer 10. If the surface roughness exceeds Ra 7 μm, the valleys of the surface irregularities may not sufficiently be filled with the liquid resin 25, possibly tending to cause resin-unfilled regions or voids. According to each of the embodiments, the surface irregularities range from Ra 0.2 to 7 μm. According to the present invention, however, the surface irregularities should preferably range from Ra 0.2 to 5 μm and more preferably range from Ra 0.2 to 3 μm.

In the case where the minute surface irregularities are formed on both of the surfaces of the second protective sheet 24, since the second protective sheet 24 can be peeled off better from the holding surface of the holding table 41 and the pressing surface 91 of the pressing unit 90, the time required for laying the protective sheet 20 is reduced.

Furthermore, according to the first embodiment, the first protective sheet 21 has, on one surface thereof to be affixed to the face side 12 of the wafer 10, the non-adhesive portion 22 that is coextensive with the central device region 15 of the substrate 11. The non-adhesive portion 22 does not leave any adhesive on the device region 15 when the protective sheet 20 is peeled off from the wafer 10. According to the second embodiment, since the first protective sheet 27 is a thermocompression bonding sheet including no glue layer, no glue layer is left on the device region 15 when the protective sheet 20 is peeled off from the wafer 10.

The present invention is not limited to the embodiments described above. Various changes and modifications may be made therein without departing from the scope of the invention. For example, if the liquid resin 25 is a thermosetting resin, then an external stimulus may be applied to the liquid resin 25 by heating the liquid resin 25 with a heater, for example, rather than irradiating the liquid resin 25 with ultraviolet rays, in steps 105 and 204.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of laying a protective sheet on a face side of a wafer including a device region where a plurality of devices are present and an outer circumferential excessive region surrounding the device region, comprising:

a first protective sheet preparing step of preparing a first protective sheet having, on one surface thereof, a non-adhesive portion to be coextensive with the device region of the wafer and an adhesive portion to be positioned along the outer circumferential excessive region of the wafer;

a first protective sheet affixing step of positioning the non-adhesive portion of the first protective sheet over the device region of the wafer, positioning the adhesive portion over the outer circumferential excessive region of the wafer, and affixing the one surface of the first protective sheet to the face side of the wafer;

a liquid resin dropping step of preparing a second protective sheet free of an adhesive layer and dropping a liquid resin that is able to be cured by an external stimulus onto a surface of the second protective sheet;

a pressing step of bringing another surface of the first protective sheet affixed to the wafer into facing relation to the surface of the second protective sheet onto which the liquid resin has been dropped and moving the first protective sheet and the second protective sheet relatively closely to each other, thereby spreading the liquid resin over the second protective sheet; and an integrating step of applying the external stimulus to the liquid resin spread in the pressing step to cure the liquid resin, thereby integrating the first protective sheet affixed to the wafer, the liquid resin, and the second protective sheet with each other, wherein the second protective sheet has surface irregularities ranging from Ra 0.2 to 7 μm on at least the surface thereof onto which the liquid resin is to be dropped.

2. A method of laying a protective sheet on a face side of a wafer including a device region where a plurality of devices are present and an outer circumferential excessive region surrounding the device region, comprising:

a first protective sheet preparing step of preparing a first protective sheet having, on one surface thereof, a non-adhesive portion to be coextensive with the device region of the wafer and an adhesive portion to be positioned along the outer circumferential excessive region of the wafer;

a first protective sheet affixing step of positioning the non-adhesive portion of the first protective sheet over the device region of the wafer, positioning the adhesive portion over the outer circumferential excessive region of the wafer, and affixing the one surface of the first protective sheet to the face side of the wafer;

a liquid resin dropping step of dropping a liquid resin that is able to be cured by an external stimulus onto another surface of the first protective sheet affixed to the wafer;

a pressing step of bringing a second protective sheet free of an adhesive layer into facing relation to the other surface of the first protective sheet onto which the liquid resin has been dropped and moving the first protective sheet and the second protective sheet relatively closely to each other, thereby spreading the liquid resin over the first protective sheet; and an integrating step of applying the external stimulus to the liquid resin spread in the pressing step to cure the liquid resin, thereby integrating the first protective sheet affixed to the wafer, the liquid resin, and the second protective sheet with each other, wherein the second protective sheet has surface irregularities ranging from Ra 0.2 to 7 μm on at least a surface thereof that faces the liquid resin.

3. A method of laying a protective sheet on a face side of a wafer, comprising:

a first protective sheet bonding step of bringing one surface of a first protective sheet free of an adhesive layer and the face side of the wafer into facing relation to each other and bringing the first protective sheet into close contact with the wafer while heating the first protective sheet, thereby integrating the first protective sheet and the wafer with each other;

a liquid resin dropping step of dropping a liquid resin that is able to be cured by an external stimulus onto another surface of the first protective sheet whose one surface has been bonded to the wafer;

a pressing step of bringing a second protective sheet free of an adhesive layer into facing relation to the other surface of the first protective sheet onto which the liquid resin has been dropped and moving the first protective sheet and the second protective sheet relatively closely to each other, thereby spreading the liquid resin over the first protective sheet; and an integrating step of applying the external stimulus to the liquid resin spread in the pressing step to cure the liquid resin, thereby integrating the first protective sheet bonded to the wafer, the liquid resin, and the second protective sheet with each other, wherein the second protective sheet has surface irregularities ranging from Ra 0.2 to 7 μm on at least the surface thereof that faces the liquid resin.

4. A method of laying a protective sheet on a face side of a wafer, comprising:

a first protective sheet bonding step of bringing one surface of a first protective sheet free of an adhesive layer and the face side of the wafer into facing relation to each other and bringing the first protective sheet into close contact with the wafer while heating the first protective sheet, thereby integrating the first protective sheet and the wafer with each other;

a liquid resin dropping step of preparing a second protective sheet free of an adhesive layer and dropping a liquid resin that is able to be cured by an external stimulus onto a surface of the second protective sheet;

a pressing step of bringing another surface of the first protective sheet whose one surface has been bonded to the wafer into facing relation to the surface of the second protective sheet onto which the liquid resin has been dropped and moving the first protective sheet and the second protective sheet relatively closely to each other, thereby spreading the liquid resin over the second protective sheet; and an integrating step of applying the external stimulus to the liquid resin spread in the pressing step to cure the liquid resin, thereby integrating the first protective sheet bonded to the wafer, the liquid resin, and the second protective sheet with each other, wherein the second protective sheet has surface irregularities ranging from Ra 0.2 to 7 μm on at least the surface thereof onto which the liquid resin is to be dropped.

5. The method of laying a protective sheet according to claim 1, wherein the integrating step includes applying active energy rays as the external stimulus to cure the liquid resin, thereby integrating the first protective sheet affixed to the wafer, the liquid resin, and the second protective sheet with each other.

6. The method of laying a protective sheet according to claim 1, further comprising:

after the integrating step, a cutting step of cutting the first protective sheet, the liquid resin, and the second protective sheet along an outer circumferential edge of the wafer.

7. A protective sheet for use in protecting a face side of a wafer, comprising:

a first protective sheet having one surface to be affixed or bonded to the face side of the wafer;

a second protective sheet having, on at least one surface thereof, surface irregularities ranging from Ra 0.2 to 7 μm; and a cured resin layer interposed between another surface of the first protective sheet whose one surface has been affixed or bonded to the face side of the wafer and the one surface of the second protective sheet that has the surface irregularities, the cured resin layer being made of a liquid resin cured by an external stimulus applied thereto, wherein the first protective sheet, the second protective sheet, and the cured resin layer are integrated with each other.

* * * * *